(12) United States Patent
Tani

(10) Patent No.: US 10,490,469 B2
(45) Date of Patent: Nov. 26, 2019

(54) POWER CONVERTING DEVICE

(71) Applicant: Mitsubishi Electric Corporation, Tokyo (JP)

(72) Inventor: Masakazu Tani, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/737,962

(22) PCT Filed: Oct. 28, 2015

(86) PCT No.: PCT/JP2015/080322
§ 371 (c)(1),
(2) Date: Dec. 19, 2017

(87) PCT Pub. No.: WO2017/072870
PCT Pub. Date: May 4, 2017

(65) Prior Publication Data
US 2018/0174934 A1    Jun. 21, 2018

(51) Int. Cl.
*H01L 23/13* (2006.01)
*H02M 7/00* (2006.01)
(Continued)

(52) U.S. Cl.
CPC .............. *H01L 23/13* (2013.01); *H01L 23/36* (2013.01); *H01L 25/07* (2013.01); *H01L 25/16* (2013.01);
(Continued)

(58) Field of Classification Search
CPC .......... H02M 1/44; H02M 7/003; H02M 7/48; H01L 23/13; H01L 25/07; H01L 25/16;
(Continued)

(56) References Cited

U.S. PATENT DOCUMENTS 5,159,545 A * 10/1992 Lee ...................... H01R 31/065
                                                            363/146
6,940,164 B1     9/2005 Yoshimatsu et al.
(Continued)

FOREIGN PATENT DOCUMENTS

JP    2009-177872 A    8/2009
JP        5190638 B2    4/2013
(Continued)

OTHER PUBLICATIONS

Communication dated May 8, 2018 from the Japanese Patent Office in counterpart Japanese application No. 2017-547244.
(Continued)

*Primary Examiner* — Jue Zhang
*Assistant Examiner* — Bart Iliya
(74) *Attorney, Agent, or Firm* — Sughrue Mion, PLLC; Richard C. Turner

(57) ABSTRACT

In a power converting device, an anode lead plate and a cathode lead plate are disposed opposed in an interior of an insulating plate, whereby the respective current directions are opposed and a magnetic field is negated, because of which inductance is reduced. Also, as external connection terminals, which are end portions of the anode lead plate and the cathode lead plate, pass through the interior of the insulating plate and are disposed in another space of the case from a lower portion of the insulating plate, the wiring distance between a capacitor element and a power semiconductor module is short, and inductance can be reduced.

16 Claims, 4 Drawing Sheets

(51) Int. Cl.
  *H01L 25/16* (2006.01)
  *H02M 7/48* (2007.01)
  *H02M 1/44* (2007.01)
  *H01L 25/18* (2006.01)
  *H01L 25/07* (2006.01)
  *H01L 23/36* (2006.01)
  *H05K 7/14* (2006.01)
  *H01L 23/367* (2006.01)
  *H01L 23/427* (2006.01)
  *H01L 23/473* (2006.01)

(52) U.S. Cl.
  CPC .............. *H01L 25/18* (2013.01); *H02M 1/44* (2013.01); *H02M 7/003* (2013.01); *H02M 7/48* (2013.01); *H05K 7/1432* (2013.01); *H01L 23/367* (2013.01); *H01L 23/427* (2013.01); *H01L 23/473* (2013.01); *H01L 2224/32225* (2013.01); *H01L 2924/10272* (2013.01); *H01L 2924/13091* (2013.01); *H01L 2924/19041* (2013.01); *H01L 2924/30107* (2013.01)

(58) Field of Classification Search
  CPC ......... H01L 25/18; H01L 23/34; H01L 23/36; H01L 23/42; H01L 23/427; H01L 23/46; H01L 23/473; H01L 21/4882
  See application file for complete search history.

(56) References Cited

U.S. PATENT DOCUMENTS

| | | | | |
|---|---|---|---|---|
| 2006/0232942 | A1* | 10/2006 | Nakatsu | B60L 11/08 361/710 |
| 2010/0259898 | A1* | 10/2010 | Kimura | H05K 7/209 361/704 |
| 2011/0228508 | A1* | 9/2011 | Inuduka | H02M 7/003 361/811 |
| 2012/0204389 | A1* | 8/2012 | Ibata | H01G 9/012 29/25.42 |
| 2015/0207119 | A1* | 7/2015 | Onodera | H01M 2/1077 429/89 |
| 2017/0194873 | A1* | 7/2017 | Takahashi | H01L 23/36 |

FOREIGN PATENT DOCUMENTS

| | | | | |
|---|---|---|---|---|
| JP | WO 2015059552 A1 * | 4/2015 | ......... | H01L 23/473 |
| WO | 02/17400 A1 | 2/2002 | | |

OTHER PUBLICATIONS

International Search Report for PCT/JP2015/080322 dated Jan. 12, 2016.

Communication dated May 28, 2019 from European Patent Office in counterpart EP Application No. 15907234.7, total of 8 pages.

* cited by examiner

POWER CONVERTING DEVICE

CROSS REFERENCE TO RELATED APPLICATIONS

This application is a National Stage of International Application No. PCT/JP2015/080322 filed Oct. 28, 2015, the contents of all of which are incorporated herein by reference in their entirety.

TECHNICAL FIELD

The present invention relates to a power converting device, and in particular, relates to a power converting device used in an inverter device mounted in a plug-in hybrid vehicle, electric vehicle, or the like.

BACKGROUND ART

A power converting device used in an inverter device is configured of a power semiconductor element that acts as a switching element, a capacitor, a reactor, resistance, and the like. As an existing capacitor, there is a capacitor such that a capacitor element and an electrode plate are housed together in a case, and the case is filled with resin.

A capacitor disclosed in, for example, Patent Document 1 such that a capacitor element is housed in a case whose upper face is opened, and main body portions of an anode plate and a cathode plate connected to the capacitor element are disposed between a bottom face portion of the case and the capacitor element in a state stacked across an insulating body. Also, external connection terminals of the anode plate and cathode plate extend in an approximate L-shape from an end portion of the main body portion, and are led out to an exterior from the opened portion of the case.

CITATION LIST

Patent Literature

Patent Document 1: Japanese Patent No. 5,190,638

SUMMARY OF INVENTION

Technical Problem

A power semiconductor module in which a power semiconductor element such as a SiC-MOSFET (metal-oxide-semiconductor field-effect transistor) is mounted is normally smaller in height than a capacitor module. Because of this, when a power semiconductor module is wired to the capacitor element disclosed in Patent Document 1, the anode plate and cathode plate connected to the capacitor element are wired in an upward direction from the bottom face of the case, led out from the upper face aperture portion, further wired in a downward direction along a side wall face of the case, and connected to the power semiconductor module. Consequently, wiring distance is long, and inductance increases.

When causing an inverter to switch at high speed using a SiC-MOSFET, there is a problem when inductance is large in that an electronic instrument malfunction occurs due to noise, or that surge voltage exceeds withstand voltage, whereby the power semiconductor module is destroyed. Also, an external connection terminal of the capacitor element is led out from the upper face side of the case, and distance to a heat dissipating portion is long, because of which heat generated by the wiring cannot be efficiently cooled. Because of this, there is a problem in that the capacitor module is destroyed due to a thermal effect of the power semiconductor module, which operates at a high temperature.

The invention, in consideration of the heretofore described problems, has an object of providing a power converting device such that inductance in wiring of a capacitor element and another electronic part can be reduced, and heat generated due to an operation of the electronic part can be efficiently cooled.

Solution to Problem

A power converting device according to the invention includes a wiring board that includes a case with an opened upper face having four side wall faces and a bottom face, an insulating plate that comes into contact with the bottom face and two of the side wall faces of the case and divides an interior of the case into two portions, a capacitor element, which is a first electronic part housed in one space of the case, a first sealing resin that seals the one space in which the capacitor element is housed, a pair of electrode plates connected to a pair of terminals of the capacitor element, and an external connection terminal for connecting the capacitor element to another electronic part, wherein one portion of the wiring board is disposed in an interior of the insulating plate, penetrates the insulating plate, and is disposed in another space of the case, and the external connection terminal, which is an end portion of the wiring board, is disposed parallel with the bottom face of the case in the other space.

Advantageous Effects of Invention

According to the power converting device according to the invention, a wiring board connected to a capacitor element penetrates an insulating plate and is disposed in another space of a case, and an external connection terminal, which is an end portion of the wiring board, is disposed parallel with a bottom face of the case in the other space, because of which a wiring distance between the capacitor element and another electronic part can be shortened, and inductance in the wiring can be reduced. Also, the external connection terminal is disposed in proximity to and parallel with the bottom face of the case, whereby heat generated due to an operation of the electronic part can be efficiently cooled.

Objects, characteristics, aspects, and advantages of the invention other than those heretofore described will become more apparent from the following detailed description of the invention, with reference to the drawings.

DESCRIPTION OF EMBODIMENTS

First Embodiment

Figure 1:
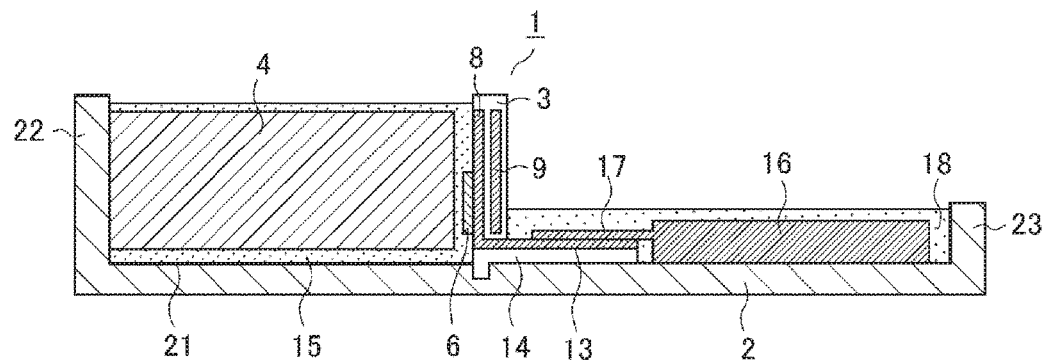
FIG. 1 is a sectional view showing a power converting device according to a first embodiment of the invention.
Figure 2:
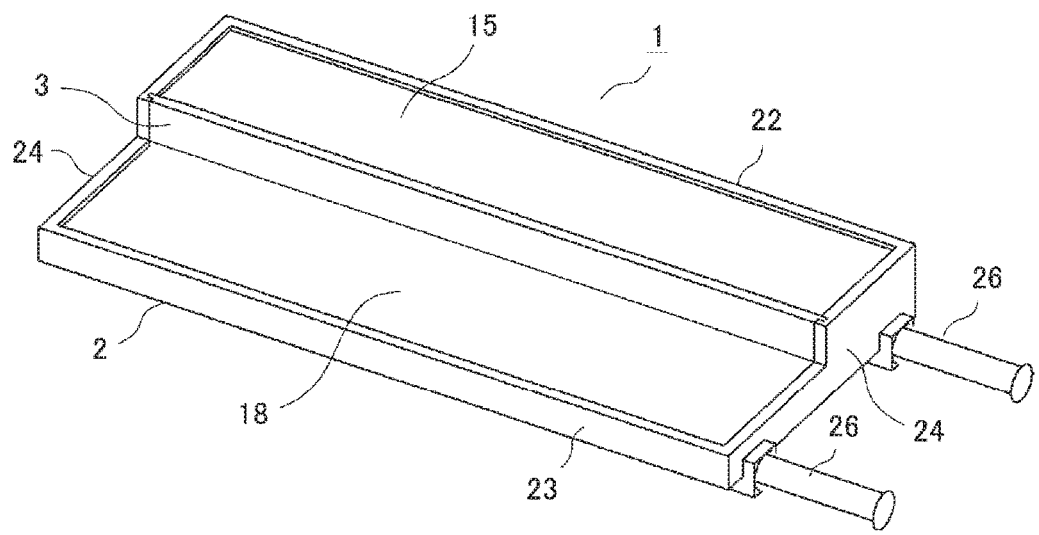
FIG. 2 is a perspective view showing the power converting device according to the first embodiment of the invention.
Figure 3:
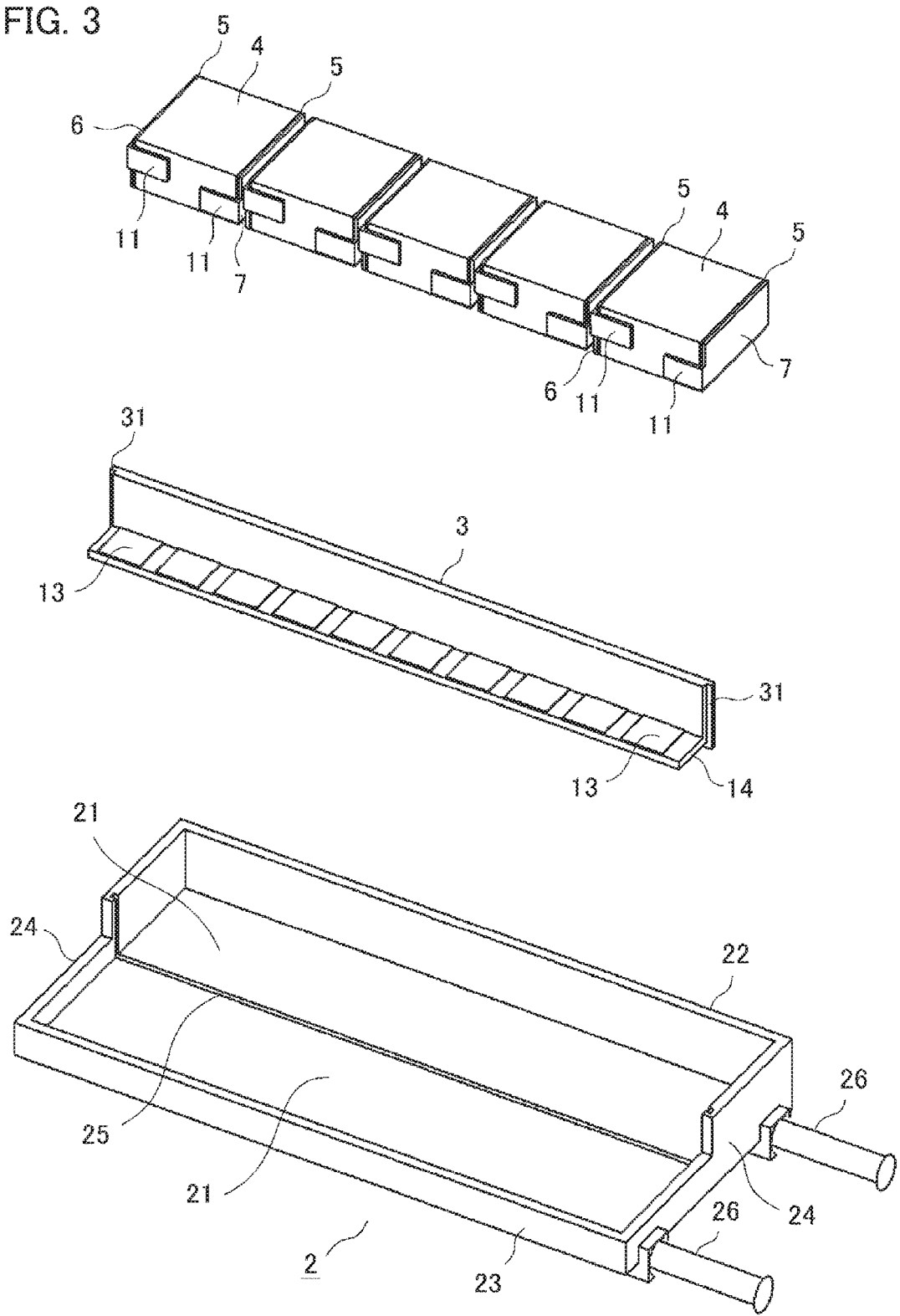
FIG. 3 is an exploded perspective view showing a capacitor of the power converting device according to the first embodiment of the invention.

Hereafter, based on the drawings, a power converting device according to a first embodiment of the invention will be described. FIG. 1 and FIG. 2 are a sectional view and perspective view showing the power converting device according to the first embodiment, and FIG. 3 is an exploded perspective view showing a capacitor of the power converting device according to the first embodiment. The same reference signs are allotted to identical or corresponding portions in the drawings.

A power converting device 1 is such that an insulating plate 3, a capacitor element 4, which is a first electronic part, an anode plate 6, a cathode plate 7, a power semiconductor module 16, which is a second electronic part, and the like, are housed in an interior of a box-type case 2 whose upper face is opened, and sealed with a first sealing resin 15 and a second sealing resin 18. A power semiconductor element such as, for example, a MOSFET, TGBT (insulated gate bipolar transistor), or diode is mounted in the power semiconductor module 16.

The case 2 is configured to include a bottom face 21, and four side wall faces including a first side wall face 22, a second side wall face 23, and side wall faces 24, as shown in FIG. 3. The case 2 has a heat dissipating function, and includes a cooling water pipe 26 as a water cooling type of cooler below the bottom face 21. The cooler type not being limited to this, the cooler may be an air cooling type, a heat pipe, a Peltier element, or the like. Also, the case 2 and cooler may be separate parts, or may be integrally molded.

The insulating plate 3 is in contact with the bottom face 21 of the case 2 and the two side wall faces 24. The insulating plate 3 has a protruding portion 31 on faces in contact with the case 2, as shown in FIG. 3, and is fixed to the case 2 in a state wherein a groove portion 25 provided in the case 2 and the protruding portion 31 are engaged.

The protruding portion 31 and the groove portion 25 may also be provided in reverse. That is, a groove portion may be provided in faces of the insulating plate 3 in contact with the case 2, and engaged with a protruding portion provided on the case 2. By adopting this kind of configuration, sealing performance between the case 2 and the insulating plate 3 is secured. An adhesive, an O-ring, a liquid packing, or the like, may be used as other means of securing sealing performance.

The capacitor element 4 is housed in one space in the case 2 partitioned by the insulating plate 3, and sealed with the first sealing resin 15. Also, the power semiconductor module 16 is housed in another space, and sealed with the second sealing resin 18. Note that a part housed in the other space is not limited to the power semiconductor module 16, and may be another electronic part.

Resins that can be cured at one time in a curing oven are selected for the first sealing resin 15 and the second sealing resin 18. A sealing resin with low moisture absorption, such as, for example, an epoxy resin, a urethane resin, or a silicone resin, is used as the first sealing resin 15. Also, for example, a silicone-based gel is used as the second sealing resin 18.

A height dimension of the power semiconductor module 16 is smaller than a height dimension of the capacitor element 4, because of which a height dimension of the second side wall face 23, which forms the space in which the power semiconductor module 16 is housed, is formed to be smaller than a height dimension of the first side wall face 22, which forms the space in which the capacitor element 4 is housed. In the same way, a height dimension of the second sealing resin 18 is formed to be smaller than a height dimension of the first sealing resin 15.

The power converting device according to the invention is characterized in that, in all of the first embodiment to a fourth embodiment, at least one portion of a wiring board is disposed in an interior of the insulating plate 3 and, penetrating the insulating plate 3, is disposed in the other space of the case 2. The wiring board includes a pair of electrode plates connected to a pair of terminals of the capacitor element 4, a pair of electrode lead plates, and an external connection terminal 13 for connecting the capacitor element 4 to another electronic part.

The capacitor element 4 is a stacked type or wound type of film capacitor configured by film being stacked or wound. However, the type of the capacitor element 4 not being limited, a ceramic capacitor, an aluminum electrolytic capacitor, or the like, can also be used. Capacitor terminals 5, which are a pair of terminals, are provided on side faces in a thickness direction of the capacitor element 4. The capacitor terminals 5 are formed as, for example, metalicon electrodes, and are connected to the anode plate 6 and the cathode plate 7, which are a pair of electrode plates.

Five of the capacitor element 4 are arrayed so that the capacitor terminals 5 are opposed, as shown in FIG. 3. One of the capacitor terminals 5 is connected to the anode plate 6, and the other terminal is connected to the cathode plate Solder is used for joining the capacitor terminal 5 and the anode plate 6 or cathode plate 7. The number of the capacitor element 4 is not limited to five, and the terminal joining method is not limited to a solder joint.

End portions of the anode plate 6 and the cathode plate 7 are bent in an L-shape along side faces perpendicular to the capacitor terminals 5, forming first terminals 11. The first terminals 11 are joined using solder to second terminals 12 formed on one end portion of an anode lead plate 8 and the cathode lead plate 9.

Figure 4:
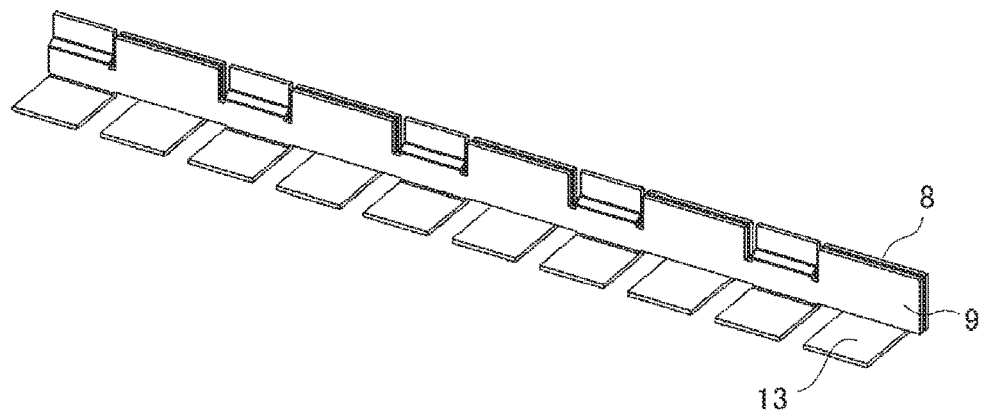
FIG. 4 is a perspective view showing an anode lead plate and cathode lead plate of the power converting device according to the first embodiment of the invention.
Figure 5:
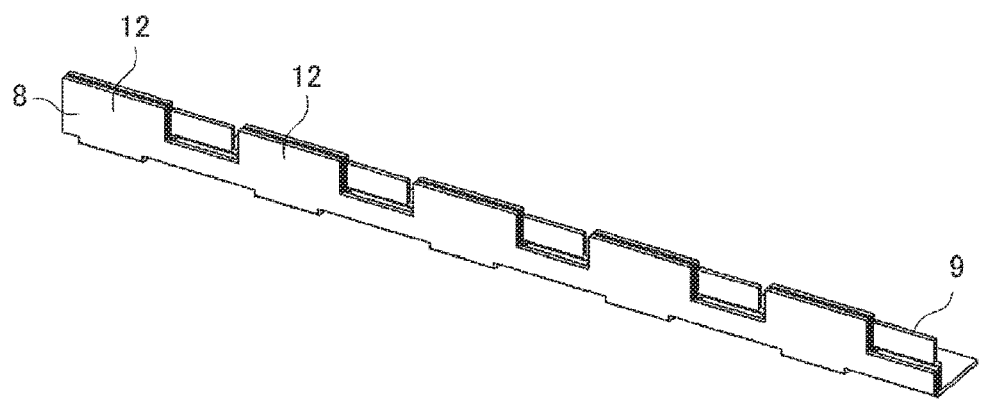
FIG. 5 is a perspective view showing the anode lead plate and cathode lead plate of the power converting device according to the first embodiment of the invention.

FIG. 4 and FIG. 5 show the anode lead plate 8 and the cathode lead plate 9 before being integrally formed with the insulating plate 3. FIG. 5 is a drawing of the anode lead plate 8 and the cathode lead plate 9 shown in FIG. 4 seen from a back side. The anode lead plate 8 and the cathode lead plate 9 are disposed opposed in the interior of the insulating plate 3, leaving an interval of approximately 2 mm.

The insulating plate 3, which is a resin molded article, can be manufactured by insert molding. That is, the insulating plate 3 is formed by the anode lead plate 8 and the cathode lead plate 9 being mounted in a molding die, and melted resin being injected around the anode lead plate 8 and the cathode lead plate 9 and cured. Furthermore, in the first embodiment, the insulating plate 3 is integrally molded with a terminal support portion 14 that supports the external connection terminal 13. Because of this, the number of parts can be reduced, and assembly becomes easier.

One end portion of the anode lead plate 8 forms the second terminal 12, and is joined to the first terminal 11 that is an end portion of the anode plate 6 in the same way, one end portion of the cathode lead plate 9 forms the second terminal 12, and is joined to the first terminal 11 that is an end portion of the cathode plate 7. Also, another end portion of the anode lead plate 8 and another end portion of the cathode lead plate 9 form the external connection terminals 13 on the anode side and cathode side respectively.

Figure 6:
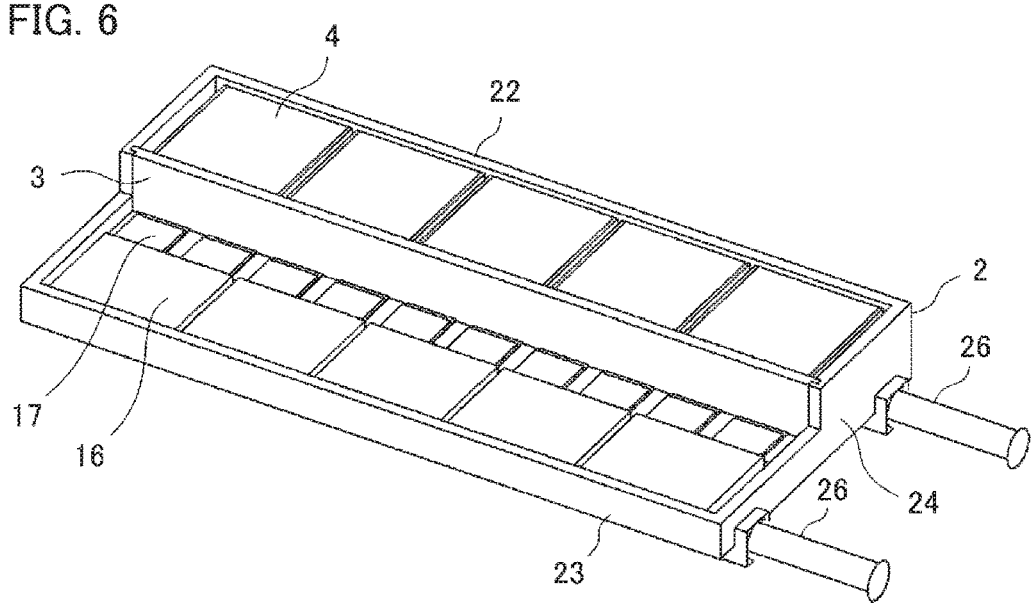
FIG. 6 is a perspective view showing an interior of the power converting device according to the first embodiment of the invention.

FIG. 6 shows an interior of the power converting device 1 before sealing with resin. The external connection terminal for connecting the capacitor element 4 to the power semiconductor module 16 is led out through the interior of the insulating plate 3 and into the other space of the case 2 from a lower portion of the insulating plate 3, and disposed approximately parallel with the bottom face 21 of the case 2. Further, the external connection terminal 13 is joined to a terminal 17 of the power semiconductor module 16, which is also disposed approximately parallel with the bottom face 21 of the case 2.

Although not shown in the drawing, the anode plate 6 and the cathode plate 7 may also be configured so as to have a pair of terminal portions protruding from an upper face aperture portion of the case 2. Specifically, end portions of the anode lead plate 8 and the cathode lead plate 9 can be caused to protrude from the upper face aperture portion of the case 2, and connected to a third electronic instrument, for example, a reactor. By adopting this kind of configuration, wiring with a multiple of electronic instruments can be carried out, and a degree of wiring freedom increases.

Also, in the first embodiment, wiring is carried out using the anode lead plate 8 and the cathode lead plate 9, but the number of parts can be reduced by the anode lead plate 8 and the cathode lead plate 9 being integrated with the anode plate 6 and cathode plate 7. However, by the anode lead plate 8 and the cathode lead plate 9 being separate parts, dimensional tolerance of the capacitor element 4 and the anode plate 6 and the cathode plate 7 is absorbed, and residual stress in a solder joint portion can be eliminated.

In order to suppress an occurrence of noise, and reduce surge voltage generated when switching a power semiconductor element, in the power converting device 1, inductance in the wiring of the capacitor element 4 and the power semiconductor module 16 needs to be reduced. In order to reduce inductance, causing the anode plate 6 (or anode lead plate 8) and the cathode plate 7 (or cathode lead plate 9) to face each other in parallel, and shortening the wiring distance, is effective.

According to the first embodiment, the anode lead plate 8 and cathode lead plate 9 are disposed opposed in the interior of the insulating plate 3, whereby the respective current directions are opposed and a magnetic field is negated, because of which inductance in the wiring can be reduced. Also, as the external connection terminals 13, which are end portions of the anode lead plate 8 and the cathode lead plate 9, pass through the interior of the insulating plate 3 and are disposed in the other space of the case 2, the wiring distance between the capacitor element 4 and the power semiconductor module 16 is short, and low inductance can be realized.

Therefore, the power converting device 1 according to the first embodiment is such that noise reduction is achieved, a malfunction of an electronic instrument caused by noise, destruction of the power semiconductor module 16, and the like, can be prevented, and high speed switching of the power semiconductor module 16 in which a SiC-MOSFET is mounted can be carried out.

Also, the external connection terminal 13 is disposed parallel with and in proximity to the bottom face 21 of the case 2, which has a heat dissipating function, because of which a sufficient heat dissipating advantage is obtained, and heat generated due to a large current flowing into the anode lead plate 8 and the cathode lead plate 9 can be efficiently cooled. Also, thermal interference in the capacitor element 4 due to heat generated by the power semiconductor module 16 can be restricted. In particular, heat from the SiC-MOSFET, which carries out a high temperature operation, being transmitted to the capacitor element 4, and the capacitor element 4 being thermally destroyed, can be prevented.

Furthermore, owing to an interior of the case 2 being partitioned with the insulating plate 3, and the capacitor element 4 being housed in one space and the power semiconductor module 16 being housed in the other space, the height dimension of the second sealing resin 18 is smaller than the height dimension of the first sealing resin 15, because of which advantages such as a reduction in size and a reduction in weight of the power converting device 1, a reduction in material costs owing to a reduction in sealing resin, and an improvement in heat dissipation, are achieved.

Second Embodiment

Figure 7:
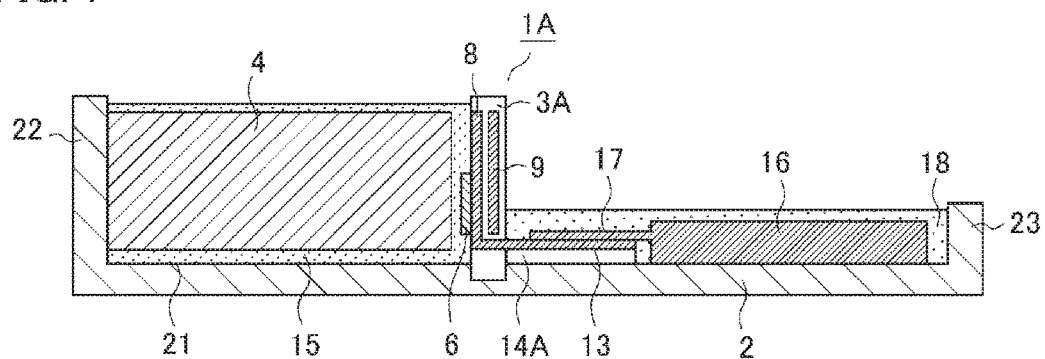
FIG. 7 is a sectional view showing a power converting device according to a second embodiment of the invention.

FIG. 7 is a sectional view showing a power converting device according to a second embodiment of the invention. In the first embodiment, a resin molded article is used as the insulating plate 3, but a power converting device 1A according to the second embodiment is such that a printed substrate is used as an insulating plate 3A. Also, a terminal supporting portion 14A that supports the external connection terminal 13 is configured as a part separate from the insulating plate 3A. Other configurations are the same as in the first embodiment, because of which a description will be omitted.

In the second embodiment, by a printed substrate being used as the insulating plate 3A, small parts necessary for configuring a circuit such as a discharge resistor, a snubber circuit, or a filter circuit can be mounted in addition to the capacitor element 4. Furthermore, efficient cooling can be carried out by the small parts being sealed with the first sealing resin 15.

As a printed substrate on which small parts are mounted does not need to be provided separately, a reduction in size of the power converting device 1A is achieved. Also, a snubber circuit, which needs to be disposed in proximity to a power semiconductor element, can be mounted on the insulating plate 3, which is effective in reducing surge voltage during an operation of the power semiconductor module 16. According to the second embodiment, in addition to the same advantages as in the first embodiment, the power converting device 1A such that still more efficient cooling can be carried out, and size can be further reduced, is obtained.

Third Embodiment

Figure 8:
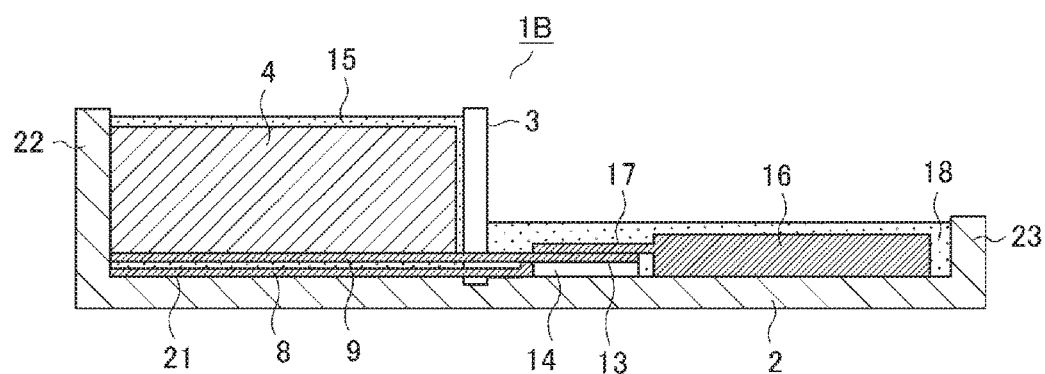
FIG. 8 is a sectional view showing a power converting device according to a third embodiment of the invention.

FIG. 8 is a sectional view showing a power converting device according to a third embodiment of the invention. In the first embodiment, the anode lead plate 8 and the cathode lead plate 9 are disposed opposed in the interior of the insulating plate 3, but in the third embodiment, the anode lead plate 8 and the cathode lead plate 9 of a power converting device 1B are disposed opposed across an insulator between a lower face of the capacitor element 4 and the bottom face 21 of the case 2. In the example shown in FIG. 8, the insulator is the first sealing resin 15, but there is also a method whereby the anode lead plate 8 and the cathode lead plate 9 sandwich insulating paper.

The external connection terminal 13 for connecting the capacitor element 4 to the power semiconductor module 16 penetrates the insulating plate 3, is led out into the other space of the case 2 from a lower portion of the insulating plate 3, and is disposed approximately parallel with the bottom face 21 of the case 2. Other configurations are the same as in the first embodiment, because of which a description will be omitted.

The array direction of the capacitor elements 4 in the power converting device 1B is such that, in the same way as in the first embodiment, the capacitor elements 4 are arrayed so that the capacitor terminals 5 are opposed (refer to FIG. 3). One of the capacitor terminals 5 is connected to the anode plate 6, and the other terminal is connected to the cathode plate 7. Solder is used for joining the capacitor terminal 5 and the anode plate 6 or the cathode plate 7.

In the third embodiment, however, end portions of the anode plate 6 and the cathode plate 7 are bent in an L-shape along lower faces of the capacitor elements 4 perpendicular to the capacitor terminals 5, forming the first terminals 11. The first terminals 11 are joined using solder to the second terminals 12, which are one end portion of the anode lead plate 8 and the cathode lead plate 9.

The anode lead plate 8 and cathode lead plate 9 are disposed opposed on the lower face of the capacitor element 4, leaving an interval of approximately 2 mm, and furthermore, penetrate the insulating plate 3, and are wired directly to the power semiconductor module 16. In this way, the larger portions of the anode lead plate 8 and the cathode lead plate 9 are wired along the bottom face 21 of the case 2, because of which efficient cooling can be carried out. According to the third embodiment, in addition to the same advantages as in the first embodiment, the power converting device 1B such that still more efficient cooling can be carried out is obtained.

Fourth Embodiment

Figure 9:
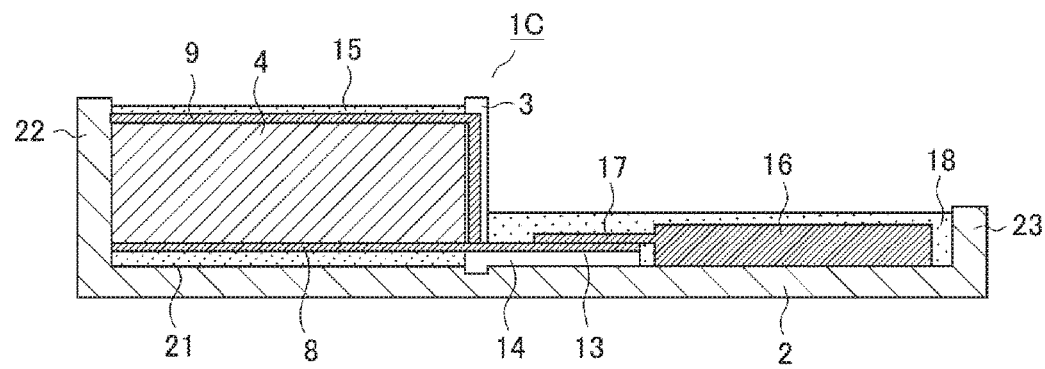
FIG. 9 is a sectional view showing a power converting device according to a fourth embodiment of the invention.

FIG. 9 is a sectional view showing a power converting device according to a fourth embodiment of the invention. A power converting device 10 according to the fourth embodiment is such that the anode lead plate 8 is disposed on the lower face of the capacitor element 4, and the cathode lead plate 9 is disposed on the upper face of the capacitor element. The reverse also being possible, however, the cathode lead plate 9 may be disposed on the lower face of the capacitor element 4, and the anode lead plate 8 may be disposed on the upper face of the capacitor element 4.

The array direction of the capacitor elements 4 in the power converting device 1C is such that, unlike the first embodiment, the capacitor elements 4 are arrayed so that the capacitor elements 4 shown in FIG. 3 are rotated by 90 degrees, and the capacitor terminals 5 are above and below. Because of this, one of the capacitor terminals 5 faces the bottom face 21 of the case 2. One of the capacitor terminals 5 is connected to the anode plate 6, and the other terminal is connected to the cathode plate 7.

The anode lead plate 8 disposed on the lower face of the capacitor element 4 penetrates the insulating plate 3 without being bent, and is wired linearly to the power semiconductor module 16. Also, the cathode lead plate 9 disposed on the upper face of the capacitor element 4 passes through the interior of the insulating plate 3, reaches a lower portion of the insulating plate 3, and is disposed, bent at 90 degrees, parallel with the anode lead plate 8. Other configurations are the same as in the first embodiment, because of which a description will be omitted.

In the fourth embodiment, the external connection terminal 13 for connecting the capacitor element 4 to the power semiconductor module 16 penetrates the insulating plate 3, is led out into the other space of the case 2 from a lower portion of the insulating plate 3, and is disposed approximately parallel with the bottom face 21 of the case 2.

According to the fourth embodiment, in addition to the same advantages as in the first embodiment, the capacitor terminals 5 are disposed in the same plane, because of which connection of the multiple of capacitor elements 4 is easy, and the power converting device 10 with a simple structure is obtained. The embodiments can be freely combined, and each embodiment can be modified or abbreviated as appropriate, without departing from the scope of the invention.

The invention claimed is:

1. A power converting device, comprising:
   a case with an opened upper face that has four side wall faces and a bottom face;
   an insulating plate that comes into contact with the bottom face and two of the four side wall faces of the case and divides an interior of the case into two portions, thereby forming a first space and a second space;
   a capacitor element housed in the first space of the case, the capacitor element being a first electronic part;
   a first sealing resin that seals the first space in which the capacitor element is housed;
   a second electronic part which is housed in the second space of the case and has a terminal which extends from an end of the second electronic part in parallel with the bottom face of the case;
   a second sealing resin that seals the second space in which the second electronic part is housed; and
   a wiring board including a pair of electrode plates connected to a pair of terminals of the capacitor element and an external connection terminal for electrically connecting the capacitor element to the terminal of the second electronic part,
   wherein the wiring board, one portion of which is disposed in an interior of the insulating plate, penetrates the insulating plate, and is disposed in the second space of the case,
   the external connection terminal, which is an end portion of the wiring board, is disposed in parallel with the bottom face of the case in the second space and makes a surface to a surface contact with the terminal of the second electronic part,
   the insulating plate extends between the first sealing resin and the second sealing resin in a first direction and from the bottom face along the two of the four side wall faces in a second direction perpendicular to the first direction, and
   the one portion of the wiring board extends in parallel to the second direction, in the interior of the insulating plate.

2. The power converting device according to claim 1, wherein the wiring board includes:
   an anode plate and a cathode plate, which are the pair of electrode plates;
   an anode lead plate of which one end portion is connected to the anode plate and another end portion is connected to the external connection terminal; and a cathode lead plate of which one end portion is connected to the cathode plate and another end portion is connected to the external connection terminal.

3. The power converting device according to claim 2, wherein the anode lead plate and the cathode lead plate are disposed opposing each other in the interior of the insulating plate.

4. The power converting device according to claim 2, wherein one lead plate among the anode lead plate and the cathode lead plate is disposed on a lower face of the capacitor element, and
  other lead plate among the one of the anode lead plate and the cathode lead plate is disposed on an upper face of the capacitor element.

5. The power converting device according to claim 2, wherein a height dimension of one side wall face, among the four side wall faces, that forms the second space in which the second electronic part is housed is smaller than a height dimension of another side wall face, among the four side wall faces, that forms the first space in which the capacitor element is housed.

6. The power converting device according to claim 2, wherein a height dimension of the second sealing resin is smaller than a height dimension of the first sealing resin.

7. The power converting device according to claim 1, wherein the insulating plate is a resin molded article.

8. The power converting device according to claim 1, wherein the insulating plate is a printed substrate.

9. The power converting device according to claim 1, wherein the insulating plate has a protruding portion on a face of the insulating plate that is in contact with the case, and
  the insulating plate is fixed to the case when a groove portion provided in the case and the protruding portion are engaged.

10. The power converting device according to claim 1, wherein the insulating plate has a groove portion in a face of the insulating plate that is in contact with the case, and
  the insulating plate is fixed to the case when a protruding portion provided in the case and the groove portion are engaged.

11. The power converting device according to claim 1, wherein a height dimension of one side wall face, among the four side wall faces, that forms the second space in which the second electronic part is housed is smaller than a height dimension of another side wall face, among the four side wall faces, that forms the first space in which the capacitor element is housed.

12. The power converting device according to claim 1, wherein a height dimension of the second sealing resin is smaller than a height dimension of the first sealing resin.

13. The power converting device according to claim 1, wherein the second electronic part is a power semiconductor module in which a SiC-MOSFET is mounted.

14. The power converting device according to claim 1, wherein the pair of electrode plates have a pair of terminal portions protruding from an upper face aperture portion of the case, and the pair of terminal portions is connected to a third electronic part.

15. The power converting device according to claim 14, wherein the third electronic part is a reactor.

16. The power converting device according to claim 1, wherein the case includes a cooler.

* * * * *